US008754633B2

United States Patent
Ng et al.

(10) Patent No.: US 8,754,633 B2
(45) Date of Patent: Jun. 17, 2014

(54) SYSTEMS AND METHOD FOR LASER VOLTAGE IMAGING STATE MAPPING

(75) Inventors: Yin Shyang Ng, San Jose, CA (US); Dmitry Skvortsov, Sunnyvale, CA (US)

(73) Assignee: DCG Systems, Inc., Fremont, CA (US)

( * ) Notice: Subject to any disclaimer, the term of this patent is extended or adjusted under 35 U.S.C. 154(b) by 985 days.

(21) Appl. No.: 12/772,899

(22) Filed: May 3, 2010

(65) Prior Publication Data

US 2010/0277159 A1    Nov. 4, 2010

Related U.S. Application Data

(60) Provisional application No. 61/174,962, filed on May 1, 2009.

(51) Int. Cl.
G01R 13/38    (2006.01)
G01R 13/40    (2006.01)

(52) U.S. Cl.
USPC .......................................... 324/97; 356/445

(58) Field of Classification Search
USPC ............ 324/750.23, 750.27, 754.21–754.31, 324/97; 356/445
See application file for complete search history.

(56) References Cited

U.S. PATENT DOCUMENTS

| 3,274,447 | A | * | 9/1966 | Nelson | ........................ 361/119 |
|---|---|---|---|---|---|
| 3,524,694 | A | | 8/1970 | Klein et al. | |
| 3,711,186 | A | | 1/1973 | O'Connor | |
| 3,912,378 | A | | 10/1975 | Goto | |
| 4,297,032 | A | | 10/1981 | Temple | |
| T102,104 | I4 | | 8/1982 | Kirk et al. | |
| 4,353,618 | A | | 10/1982 | Hagner et al. | |
| 4,555,767 | A | | 11/1985 | Case et al. | |
| 4,588,950 | A | | 5/1986 | Henley | |
| 4,615,620 | A | | 10/1986 | Noguchi et al. | |
| 4,625,114 | A | | 11/1986 | Bosacchi et al. | |
| 4,634,234 | A | | 1/1987 | Baumann | |
| 4,680,635 | A | | 7/1987 | Khurana | |
| 4,681,449 | A | | 7/1987 | Bloom et al. | |
| 4,698,587 | A | | 10/1987 | Burns et al. | |
| 4,721,910 | A | | 1/1988 | Bokor et al. | |
| 4,724,322 | A | | 2/1988 | Knowles et al. | |
| 4,736,159 | A | | 4/1988 | Shiragasawa et al. | |
| 4,758,092 | A | | 7/1988 | Heinrich et al. | |
| 4,758,786 | A | | 7/1988 | Hafeman | |
| 4,811,090 | A | | 3/1989 | Khurana | |
| 4,908,568 | A | | 3/1990 | Gerald | |

(Continued)

OTHER PUBLICATIONS

Anderson P. W. et al., "Radio-Frequency Effects in Superconducting Thin Film Bridges," Phys. Rev. Lett. 13, Aug. 1964, pp. 195-197.

(Continued)

*Primary Examiner* — Huy Q Phan
*Assistant Examiner* — Giovanni Astacio-Oquendo
(74) *Attorney, Agent, or Firm* — Nixon Peabody LLP; Joseph Bach, Esq.

(57) ABSTRACT

An apparatus and method for laser probing of a DUT is disclosed. The system enables laser voltage imaging state mapping of devices within the DUT. A selected area of the DUT is illuminating a while the DUT is receiving test signals causing certain of the active devices to modulate. Light reflected from the DUT is collected and is converted into an electrical signal. Phase information is extracting from the electrical signal and a two-dimensional image is generated from the phase information, wherein the two-dimensional image spatially correlates to the selected area.

11 Claims, 7 Drawing Sheets

(56) References Cited

U.S. PATENT DOCUMENTS

| | | | |
|---|---|---|---|
| 4,956,603 A | 9/1990 | Russo | |
| 4,968,932 A | 11/1990 | Baba et al. | |
| 5,004,307 A | 4/1991 | Kino et al. | |
| 5,010,945 A | 4/1991 | Burke | |
| 5,087,121 A | 2/1992 | Kakuchi et al. | |
| 5,208,648 A | 5/1993 | Batchelder et al. | |
| 5,220,403 A | 6/1993 | Batchelder et al. | |
| 5,247,392 A | 9/1993 | Plies | |
| 5,282,088 A | 1/1994 | Davidson | |
| 5,334,540 A | 8/1994 | Ishii | |
| 5,412,328 A | 5/1995 | Male et al. | |
| 5,430,292 A | 7/1995 | Honjo et al. | |
| 5,430,305 A | 7/1995 | Cole, Jr. et al. | |
| 5,453,994 A | 9/1995 | Kawamoto et al. | |
| 5,457,536 A | 10/1995 | Kornfield et al. | |
| 5,475,316 A | 12/1995 | Hurley et al. | |
| 5,493,236 A | 2/1996 | Ishii et al. | |
| 5,532,607 A | 7/1996 | Inuzuka et al. | |
| 5,532,873 A | 7/1996 | Dixon | |
| 5,757,193 A | 5/1998 | Yu et al. | |
| 5,767,688 A * | 6/1998 | Takahashi et al. | 324/754.23 |
| 5,854,804 A | 12/1998 | Winer et al. | |
| 5,872,360 A * | 2/1999 | Paniccia et al. | 250/341.4 |
| 5,930,588 A | 7/1999 | Paniccia | |
| 5,940,545 A | 8/1999 | Kash et al. | |
| 6,057,677 A | 5/2000 | Wakana et al. | |
| 6,072,179 A | 6/2000 | Paniccia et al. | |
| 6,168,311 B1 | 1/2001 | Xiao et al. | |
| 6,251,706 B1 | 6/2001 | Paniccia | |
| 6,252,412 B1 | 6/2001 | Talbot et al. | |
| 6,462,814 B1 | 10/2002 | Lo | |
| 6,509,750 B1 | 1/2003 | Talbot et al. | |
| 6,591,121 B1 | 7/2003 | Madarasz et al. | |
| 6,594,086 B1 | 7/2003 | Pakdaman et al. | |
| 6,605,951 B1 | 8/2003 | Cowan | |
| 6,621,275 B2 | 9/2003 | Cotton et al. | |
| 6,633,366 B2 | 10/2003 | De Jager et al. | |
| 6,720,588 B2 | 4/2004 | Vickers | |
| 6,727,501 B1 | 4/2004 | Fan et al. | |
| 6,739,511 B2 | 5/2004 | Tsikos et al. | |
| 6,778,327 B2 | 8/2004 | Pakdaman et al. | |
| 6,788,396 B2 | 9/2004 | Stolte et al. | |
| 6,797,581 B2 | 9/2004 | Vickers | |
| 6,798,562 B2 | 9/2004 | Hakimi et al. | |
| 6,812,464 B1 | 11/2004 | Sobolewski et al. | |
| 6,836,131 B2 | 12/2004 | Cader et al. | |
| 6,897,664 B1 | 5/2005 | Bruce et al. | |
| 6,963,076 B1 * | 11/2005 | Zaman et al. | 250/559.4 |
| 6,971,791 B2 | 12/2005 | Borden et al. | |
| 7,605,597 B2 | 10/2009 | Aghababazadeh et al. | |
| 7,642,973 B2 * | 1/2010 | Maekawa et al. | 343/703 |
| 7,792,185 B2 * | 9/2010 | Bulzacchelli et al. | 375/233 |
| 7,872,485 B2 | 1/2011 | Colvin | |
| 7,990,167 B2 * | 8/2011 | Kasapi | 324/754.23 |
| 8,358,141 B2 * | 1/2013 | Xiang et al. | 324/635 |
| 2005/0218921 A1 * | 10/2005 | Sanda et al. | 324/765 |
| 2006/0066325 A1 | 3/2006 | McGinnis et al. | |
| 2006/0076503 A1 | 4/2006 | Tsao | |
| 2006/0273263 A1 | 12/2006 | Raymond et al. | |
| 2007/0046301 A1 * | 3/2007 | Kasapi | 324/751 |
| 2013/0222004 A1 * | 8/2013 | Nakanishi et al. | 324/754.23 |

OTHER PUBLICATIONS

Bergner, H. et al., "Dynamic Laser Beam Testing of a n-MOS Device," Microelectronic Engineering, vol. 15, 1991, pp. 109-112, Elsevier Science Publishers B.V.

Bergner, H. et al., "Identification of Hot Spots in Integrated Circuits by Laser Scanning Microscopy," Microelectronic Engineering, vol. 14, 1991, pp. 121-131, Elsevier Science Publishers, B.V.

Bergner, H. et al., "A Time-Resolved Optical Beam Induced Current Method," Microelectronic Engineering, 12 (1990), pp. 143-148, Elsevier Science Publishers B.V.

Black, A. et al., "Optical Sampling of GHz Charge Density Modulation in Silicon Bipolar Junction Transistors," Electronics Letters, vol. 23, No. 15, 1987, p. 783-784.

Bruce, M. et al., "Waveform Acquisition from the Backside of Silicon Using Electro-Optic Probing," Proceedings from the 25th International Symposium for Testing and Failure Analysis, Nov. 1999, pp. 19-25.

Buller, G.S. et al., "All-Solid-State Microscope-Based System for Picosecond Time-Resolved Photoluminescence Measurements on II-VI Semiconductors," Rev. Sci. Instrum., vol. 63, Issue 5, May 1992, American Institute of Physics.

Buller, G.S. et al., "Time-resolved Photoluminescence Measurements of InGaAs/InP Multiple-Quantum-Well Structures at 1.3-µm Wavelengths by Use of Germanium Single-Photon Avalanche Photodiodes," Applied Optics, vol. 35, No. 6, Feb. 1996, pp. 916-921.

Charbonneau, S. et al., "Two-Dimensional Time-Resolved Imaging with 100-ps. Resolution Using a Resistive Anode Photomultiplier Tube," Rev. Sci. Instrum., vol. 63, Issue 11, Nov. 1992, American Institute of Physics.

Chester, M. et al., "Electroabsorption Spectrum in Silicon," Physical Review Letters, vol. 13, No. 6, Aug. 1964, pp. 193-195.

Cole, E. et al., "Novel Failure Analysis Techniques Using Photo Probing With a Scanning Optical Microscope," IEEE/IRPS, 1994, pp. 388-398.

Duckworth, H. et al., "Masses of $Cr^{50}$, $Cr^{52}$, and $Fe^{54}$," Physical Review, vol. 78, Issue 2, Feb. 1950, pp. 179.

Esfahani, F. et al., "Testability Improvement of Highly Integrated Circuits by Optical Injection of Logical Levels into the Circuit," Institut für Mikroelektronik, Technische Universität Berlin, 1997, pp. 288-295.

Eiles, Travis M. et al., "Optical Probing of VLSI IC's from the Silicon Backside," Proceedings from the 25th International Symposium for Testing and Failure Analysis, Nov. 1999, pp. 27-33.

Falk, Dr. R. Aaron, "IVT Imagery," OptoMetrix, Inc, 1996.

Fan, H.Y. et al., "Infra-Red Absorption of Silicon," Letters to the Editor, Feb. 1950, p. 178.

Frova, A. et al., "Electro-Absorption Effects at the Band Edges of Silicon and Germanium," Physical Review, vol. 145, No. 2., May 1966, pp. 575-583.

Gutkin, A.A. et al., "Influence of the Orientation of the Electric Field on the Polarization Dependence of on the Electroabsorption in Silicon," Soviet Physics—Semiconductors, vol. 8, No. 6, Dec. 1974, pp. 781-782.

Gutkin, A.A. et al., "Influence of the Polarization of Light on the Electroabsorption in Silicon," Soviet Physics—Semiconductors, vol. 6, No. 9, Mar. 1973, pp. 1524-1527.

Heinrich, H.K., "Picosecond Noninvasive Optical Detection of Internal Electrical Signals in Flip-Chip-Mounted Silicon Integrated Circuits," IBM Journal of Research and Development, vol. 34, Issue 2/3, 1990, p. 162-172.

Heinrich, H.K. et al., "Noninvasive Sheet Charge Density Probe for Integrated Silicon Devices," Applied Physics Letters, vol. 48, Issue 16, 1986, p. 1066-1068.

Heinrich, H.K. et al., "Erratum: Noninvasive Sheet Charge Density Probe for Integrated Silicon Devices," Applied Physics Letters, vol. 48, Issue 26, 1986, p. 1811.

Heinrich, H.K. et al., "VB-3 Noninvasive Optical Sheet Charge Density Probe for Silicon Integrated Circuits," Electron Devices, IEEE Transactions, vol. 33, Issue 11, Nov. 1986, pp. 1860-1860.

Heinrich, H.K. et al., "Picosecond Backside Optical Detection of Internal Signals in Flip-Chip Mounted Silicon VLSI Circuits," 3rd European Conference on Electron and Optical Beam Testing of Integrated Circuits, Sep. 1991.

Heinrich, H.K. et al., "Measurement of Real-Time Digital Signals in a Silicon Bipolar Junction Transistor Using a Noninvasive Optical Probe," IEEE Electronics Letters, vol. 22, No. 12, Jun. 1986, pp. 650-652.

Hemenway, B.R. et al., "Optical Detection of Charge Modulation in Silicon Integrated Circuits Using a Multimode Laser-Diode Probe," IEEE Electron Device Letters, vol. 8, No. 8, Aug. 1987, pp. 344-346.

Kasapi, S. et al., "Laser Beam Backside Probing of CMOS Integrated Circuits," Microelectronics Reliability, vol. 39, 1999, pp. 957-961.

(56) References Cited

OTHER PUBLICATIONS

Kash, J.A. et al., "Full Chip Optical Imaging of Logic State Evolution in CMOS Circuits," IEDM, 1996, Late News Paper.

Khurana, N. et al., "Analysis of Product Hot Electron Problems by Gated Emission Microscopy," IEEE/IRPS, 1986, pp. 189-194.

Kindereit, U. et al., "Comparison of Laser Voltage Probing and Mapping Results in Oversized and Minimum Size Devices of 120nm and 65nm Technology," Microelectronics Reliability, vol. 48, Issues 8/9, Sep. 2008, pp. 1322-1326, 19th European Symposium on Reliability of Electron Devices, Failure Physics and Analysis (ESREF 2008).

Kindereit, U. et al., "Investigation of Laser Voltage Probing Signals in CMOS Transistors," Reliability Physics Symposium, 2007, Proceedings 45th Annual IEEE International, Apr. 2007, pp. 526-533.

Kindereit, U. et al., "Quantitative Investigation of Laser Beam Modulation in Electrically Active Devices as Used in Laser Voltage Probing," IEEE Transactions on Device and Materials Reliability, vol. 7, Issue 1, Mar. 2007, pp. 19-30.

Kolachina, S. et al., "Optical Waveform Probing-Strategies for Non-Flipchip Devices and Other Applications," Conference Proceedings from the 27th International Symposium for Testing and Failure Analysis (ISFTA), Nov. 2001, pp. 51-57.

Kudva, S.M., "The Sematech Failure Analysis Roadmap," ISTFA 1995, 21st International Symposium for Testing and Failure Analysis, Nov. 1995, pp. 1-5.

Kume, H., et al., "Ultrafast Microchannel Plate Photomultipliers," Applied Optics, vol. 27, No. 6, Mar. 1988, pp. 1170-1178.

Lo, W. et al., "Polarization Difference Probing: A New Phase Detection Scheme for Laser Voltage Probing," Proceedings from the 30th International Symposium for Testing and Failure Analysis, Nov. 2004, Worcester, Massachusetts.

Löffler, T., et al., "Stable Optoelectronic Detection of Free-Running Microwave Signals with 150-GHz Bandwidth," Microelectronic Engineering, vol. 31, 1996, pp. 397-408, Elsevier Science B.V.

Mertin, W., et al., "Contactless Gigahertz Testing," Gerhard-Mercator-Universität Duisburg, 1998.

Nikawa, K., et al., "Verification and Improvement of the Optical Beam Induced Resistance Change (OBIRCH) Method," Proceedings of the 20th International Symposium for Testing and Failure Analysis, Nov. 1994, pp. 11-16.

Nikawa, Kiyoshi, et al., "LSI Failure Analysis Using Focused Laser Beam Heating," pp. 307-312, 1996.

Nikawa, K. et al., "New Laser Beam Heating Methods Applicable to Fault Localization and Defect Detection in VLSI Devices," IEEE, 1996, pp. 346-354.

Nikawa, K. et al., "New VLSI Failure Analysis Method Using Infrared Laser Beam," 1996.

Nikawa, K. et al., "Various Contrasts Identifiable from the Backside of a Chip by 1.3 µm Laser Beam Scanning and Current Change Imaging," Proceedings ISTFA, Nov. 20, 1996, pp. 1-6.

Paniccia, M. et al., "Novel Optical Probing Technique for Flip Chip Packaged Microprocessors," International Test Conference, IEEE 1998.

Redfield, D., "Effect of Defect Fields on the Optical Absorption Edge," Physical Review, May 1963, vol. 130, No. 3, pp. 916-918.

Restle, P. et al., "Internal Probing of Submicron FETs and Photoemission Using Individual Oxide Traps," IBM Journal of Research and Development, Mar./May 1990, vol. 34, No. 2/3, pp. 227-241.

Soref, R.A. et al., "Electrooptical Effects in Silicon," IEEE Journal of Quantum Electronics, vol. 23, Issue 1, Jan. 1987, pp. 123-129.

Tsang, J.C., et al., "Picosecond Hot Electron Light Emission from Sub-Micron Complementary Metal Oxide Semiconductor Circuits," Applied Physics Letters, Feb. 1997, vol. 70, Issue 7, pp. 889-891.

Valdamanis, J. A. et al., "Subpicosecond Electrical Sampling," IEEE Journal of Quantum Electronics, vol. 19, No. 4, Apr. 1983, pp. 664-667.

Weingarten, K. et al., "Picosecond Optical Sampling of GaAs Integrated Circuits," IEEE Journal of Quantum Electronics, vol. 24, No. 2, Feb. 1988, pp. 198-205.

Wilsher, K. et al., "Integrated Circuit Waveform Probing Using Optical Phase Shift Detection," Proceedings from the 26th International Symposium for Testing and Failure Analysis, Nov. 2000, pp. 479-485.

Wilsher, K. R., et al., "Practical Optical Waveform Probing of Flip-Chip CMOS Devices," ITC International Test Conference, Paper 35.1, 1999.

Xu, C. et al., "Two-Photon Optical Beam Induced Current (OBIC) Imaging Through the Backside of Integrated Circuits ," Murray Hill, New Jersey, 1997.

Yee, W. M., et al., "Laser Voltage Probe (LVP): A Novel Optical Probing Technology for Flip-Chip Packaged Microprocessors," Conference Proceedings from the 26th International Symposium for Testing and Failure Analysis (ISFTA), Nov. 2000, pp. 3-8.

* cited by examiner

SYSTEMS AND METHOD FOR LASER VOLTAGE IMAGING STATE MAPPING

CROSS-REFERENCE TO RELATED APPLICATION

This application claims the benefit of priority from U.S. Provisional Patent Application No. 61/174,962 filed on May 1, 2009, the entire disclosure of which is relied upon and incorporated by reference herein.

BACKGROUND

1. Field of the Invention

The present invention relates to an apparatus and method for probing integrated circuits using laser illumination.

2. Description of the Related Art

Probing systems have been used in the art for testing and debugging integrated circuit (IC) designs and layouts. Various laser-based systems for probing IC's are known in the prior art. While some description of the prior art is provided herein, the reader is encouraged to also review U.S. Pat. Nos. 5,208,648, 5,220,403 and 5,940,545, which are incorporated herein by reference in their entirety. Additional related information can be found in Yee, W. M., et al. *Laser Voltage Probe (LVP): A Novel Optical Probing Technology for Flip-Chip Packaged Microprocessors*, in International Symposium for Testing and Failure Analysis (ISTFA), 2000, p 3-8; Bruce, M. et al. *Waveform Acquisition from the Backside of Silicon Using Electro-Optic Probing*, in International Symposium for Testing and Failure Analysis (ISTFA), 1999, p 19-25; Kolachina, S. et al. *Optical Waveform Probing—Strategies for Non-Flipchip Devices and Other Applications*, in International Symposium for Testing and Failure Analysis (ISTFA), 2001, p 51-57; Soref, R. A. and B. R. Bennett, *Electrooptical Effects in Silicon*. IEEE Journal of Quantum Electronics, 1987. QE-23(1): p. 123-9; Kasapi, S., et al., Laser Beam Backside Probing of CMOS Integrated Circuits. Microelectronics Reliability, 1999. 39: p. 957; Wilsher, K., et al. Integrated Circuit Waveform Probing Using Optical Phase Shift Detection, in International Symposium for Testing and Failure Analysis (ISTFA), 2000, p 479-85; Heinrich, H. K., Picosecond Noninvasive Optical Detection of Internal Electrical Signals in Flip-Chip-Mounted Silicon Integrated Circuits. IBM Journal of Research and Development, 1990. 34(2/3): p. 162-72; Heinrich, H. K., D. M. Bloom, and B. R. Hemenway, Noninvasive sheet charge density probe for integrated silicon devices. Applied Physics Letters, 1986. 48(16): p. 1066-1068; Heinrich, H. K., D. M. Bloom, and B. R. Hemenway, Erratum to Noninvasive sheet charge density probe for integrated silicon devices. Applied Physics Letters, 1986. 48(26): p. 1811; Heinrich, H. K., et al., Measurement of real-time digital signals in a silicon bipolar junction transistor using a noninvasive optical probe. IEEE Electron Device Letters, 1986. 22(12): p. 650-652; Hemenway, B. R., et al., Optical detection of charge modulation in silicon integrated circuits using a multimode laser-diode probe. IEEE Electron Device Letters, 1987. 8(8): p. 344-346; A. Black, C. Courville, G Schultheis, H. Heinrich, Optical Sampling of GHz Charge Density Modulation in SIlicon Bipolar Junction Transistors Electronics Letters, 1987, Vol. 23, No. 15, p. 783-784, which are incorporated herein by reference in their entirety and Kindereit U, Boit C, Kerst U, Kasapi S, Ispasoiu R, Ng R, Lo W, Comparison of Laser Voltage Probing and Mapping Results in Oversized and Minimum Size Devices of 120 nm and 65 nm Technology, Microelectronics Reliability 48 (2008) 1322-1326, 19th European Symposium on Reliability of Electron Devices, Failure Physics and Analysis (ESREF 2008).

As is known, during debug and testing of an IC, a commercially available testing platform, such as, e.g., Automated Testing Equipment, also known as an Automated Testing and Evaluation (ATE) tester, is used to generate test patterns (also referred to as test vectors) to be applied to the IC device under test (DUT). Various systems and method can then be used to test the response of the DUT to the test vectors. One such method is generally referred to as laser voltage probing (LVP). When a laser-based system such as an LVP is used for probing, the DUT is illuminated by the laser and the light reflected from the DUT is collected by the probing system. As the laser beam strikes the DUT, the laser beam is modulated by the response of various elements of the DUT to the test vectors. This has been ascribed to the electrical modulation of the free carrier density, and the resultant perturbation of the index of refraction and absorption coefficient of the material of the IC, most commonly silicon. Accordingly, analysis of the reflected light provides information about the operation of various devices in the DUT.

FIG. 1 is a general schematic depicting major components of a laser-based voltage probe system architecture, 100, according to the prior art. In FIG. 1, dashed arrows represent optical path, while solid arrows represent electronic signal path. The optical paths represented by curved lines are generally made using fiber optic cables. Probe system 100 comprises a laser source which, in this particular example, is a dual laser source, DLS 110, an optical bench 112, and data acquisition and analysis apparatus 114. The optical bench 112 includes provisions for mounting the DUT 160. A conventional ATE tester 140 provides stimulus signals and receives response signals 142 to/from the DUT 160 and may provide trigger and clock signals, 144, to the time-base board 155. The signal from the tester is generally transferred to the DUT via test boards, DUT board (adapter plate) and various cables and interfaces that connect all of these components. The time-base board 155 synchronizes the signal acquisition with the DUT stimulus and the laser pulses. Workstation 170 controls as well as receives, processes, and displays data from the signal acquisition board 150, time-base board 155, and the optical bench 112.

The various elements of probe system 100 will now be described in more detail. Since temporal resolution is of high importance in testing DUT's, the embodiment of FIG. 1 utilizes prior art pulsed lasers, wherein the laser pulse width determines the temporal resolution of the system. Dual laser source 110 consists of two lasers: a pulsed mode-locked laser, MLL 104, source that is used to generate 10-35 ps wide pulses, and a continuous-wave laser source, CWL 106, that can be externally gated to generate approximately 1 s wide pulses. The MLL 104 source runs at a fixed frequency, typically 100 MHz, and must be synchronized with the stimulus 142 provided to the DUT 160, via a phase-locked loop (PLL) on the time-base board 155, and the trigger and clock signals 144 provided by the ATE tester. The output of the DLS 110 is transmitted to the optical bench 112 using fiber optics cable 115. The light beam is then manipulated by beam optics 125, which directs the light beam to illuminate selected parts of the DUT 160. The beam optics 125 consists of a Laser Scanning Microscope (LSM 130) and beam manipulation optics (BMO 135). The specific elements that are conventional to such an optics setup, such as objective lens, etc., are not shown. Generally, BMO 135 consists of optical elements necessary to manipulate the beam to the required shape, focus, polarization, etc., while the LSM 130 consists of elements necessary for scanning the beam over a specified area of the DUT. In addition to scanning the beam, the LSM 130 has vector-pointing mode to direct the laser beams to anywhere within the field-of-view of the LSM and Objective Lens. The X-Y-Z stage 120 moves the beam optics 125 relative to the stationary DUT 160. Using the stage 120 and the vector-pointing mode of the LSM 130, any point of interest on the DUT 160 may be illuminated and probed.

For probing the DUT 160, the ATE 140 sends stimulus signals 142 to the DUT, in synchronization with the trigger and clock signals provided to the phase-locked loop on the time-base board 155. The phase-lock loop controls the MLL 104 to synchronize its output pulses to the stimulus signals 142 to the DUT. MLL 104 emits laser pulses that illuminate a particular device of interest on the DUT that is being stimulated. The reflected light from the DUT is collected by the beam optics 125, and is transmitted to photodetector 138 via fiber optic cable 134. The reflected beam changes character depending on the reaction of the device to the stimulus signal. To monitor incident laser power, for purposes of compensating for laser power fluctuations, for example, optical bench 112 provides means to divert a portion of MLL 104 incident pulse to photodetector 136 via fiber optic cable 132. The output signal of the photosensors 136, 138 is sent to signal acquisition board 150, which, in turn, sends the signal to the controller 170. By manipulation of the phase lock loop on the time-base board 155, controller 170 controls the precise time position of MLL 104 pulses with respect to DUT 160 stimulus signals 142. By changing this time position and monitoring the photosensors signals, the controller 170 can analyze the temporal response of the DUT to the stimulus signals 142. The temporal resolution of the analysis is dependent upon the width of the MLL 104 pulse.

It is also known in the art to perform continuous wave LVP, wherein a continuous wave laser is used to illuminate a device on the DUT and the continuously reflected light is collected. The continuously reflected light contains timing information relating to the response, i.e., switching, of the active device to various stimulus signals. The reflected light signal is continuously converted into electrical signal by a photodetector, e.g., avalanche photodiode (APD) and is amplified. The timing information is contained within the electrical signal and represents detected modulation of the device, which can then be displayed in either the time-domain using an oscilloscope or in the frequency domain using a spectrum analyzer.

Recently the technology of laser voltage imaging has been developed to provide a two-dimensional gray-scale image correlating to voltages at different points in an area of the DUT. More specifically, an LSM is used to raster-scan an area of the DUT and at each point within the area the reflected light signal is collected and provides a single data value. That is, rather than providing the spectra over a range of frequency band, at each point the amplitude of the signal at a particular frequency spectrum is obtained from the spectrum analyzer. In practice, the spectrum analyzer is set to extract a single frequency of interest (called zero-span), and to provide an output value that is directly proportional to the strength of the received signal at that frequency. Consequently, as the LSM scans the selected area of the DUT, if there is no activity at the frequency of interest, the spectrum analyzer provides low or no output, while if there is activity at that frequency, the spectrum analyzer provides high output. That is, the spectrum analyzer provides an output signal whose amplitude is proportional to the strength of the signal at the selected frequency of interest. This output can be used to generate a map of the scanned area, showing gray-scale levels corresponding to device activity at each point in the scanned area.

While the above systems and methods provide valuable information about the functionality of the DUT, it is desirable to non-invasively obtain further information about the response of various active devices within the DUT.

SUMMARY

The following summary is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Various embodiments of the present invention provide apparatus and method for laser voltage imaging state mapping of a DUT.

An apparatus and method for laser probing of a DUT is disclosed. The system enables laser voltage imaging state mapping of devices within the DUT. A selected area of the DUT is illuminated while the DUT is receiving test signals causing certain active devices to switch. Light reflected from the DUT is collected and is converted into an electrical signal. Phase information is extracted from the electrical signal and a two-dimensional image is generated from the phase information, wherein the two-dimensional image spatially correlates to the selected area.

Other aspects and features of the invention will become apparent from the description of various embodiments described herein, and which come within the scope and spirit of the invention as claimed in the appended claims.

Figure 1:
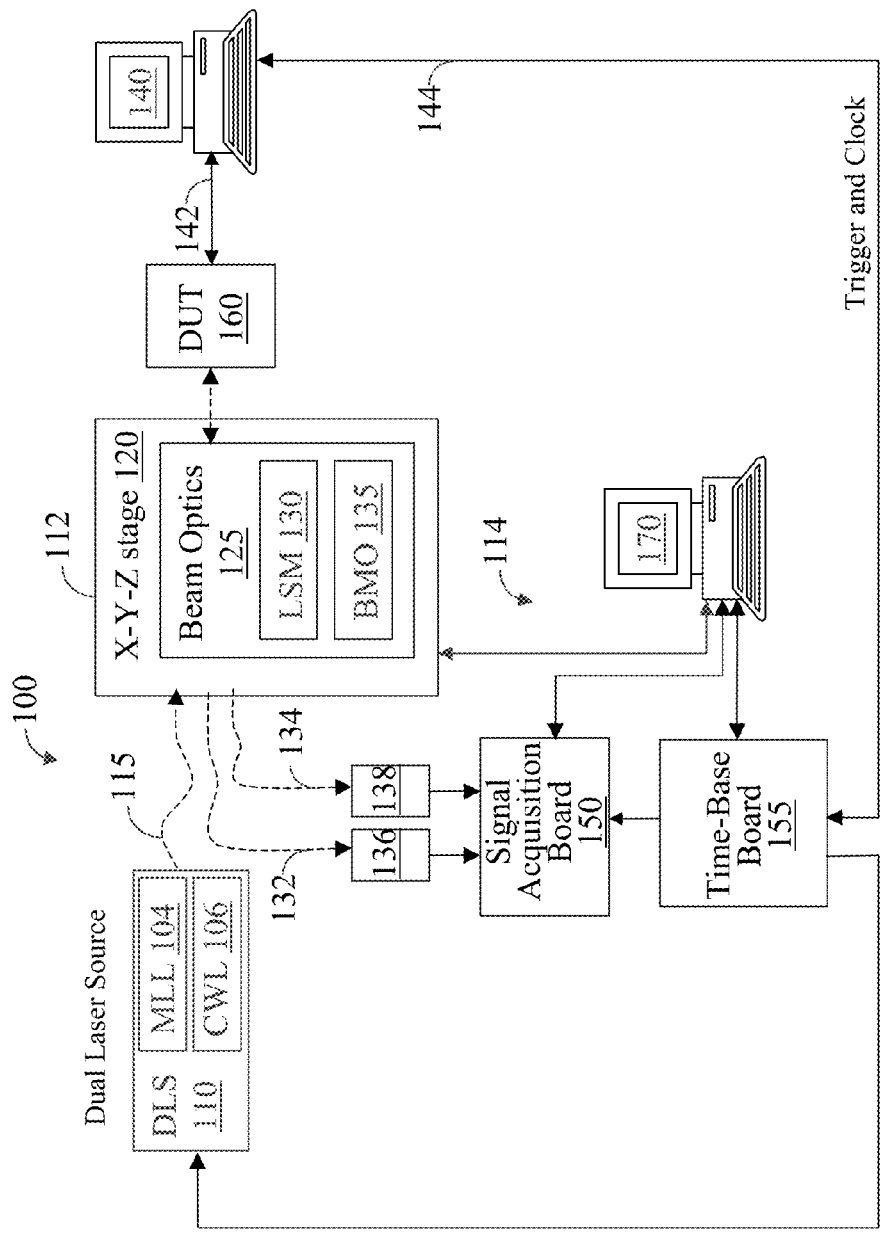
FIG. 1 is a general schematic depicting major components of a laser-based voltage probe system architecture according to the prior art.

The invention is described herein with reference to particular embodiments thereof, which are exemplified in the drawings. It should be understood, however, that the various embodiments depicted in the drawings are only exemplary and may not limit the invention as defined in the appended claims.

DETAILED DESCRIPTION

Various embodiments of the present invention provide apparatus and method for non-invasive, non-contact method for differentiating the relative polarity of active transistors within a selected area of the DUT, without prior knowledge of the design of the IC. These system and method are referred to herein as laser voltage imaging (LVI) state mapping of a DUT. The described methodologies augment the prior art system by providing phase information for various active devices within the DUT. The phase information can be provided in the form of a map of a scanned area of the DUT, wherein grayscale is used to indicate phase information of active devices, i.e., transistors, that are located within the scanned area. This enables testing and debug of IC's even when the circuit design is not available.

According to one embodiment of the invention, a lock-in amplifier is used to perform LVI state mapping of an area of interest within the DUT. This embodiment provides the ability to observe relative logic states of the various active transistors by extracting phase information from the reflected laser light. According to one embodiment, the lock-in amplifier is used to determine the phase of the reflected signal relative to a reference signal, which may be generated internally by the lock-in amplifier, or fed externally to the lock-in amplifier. According to one implementation, this is achieved by replacing the spectrum analyzer of a conventional LVI with a lock-in amplifier.

Figure 2:
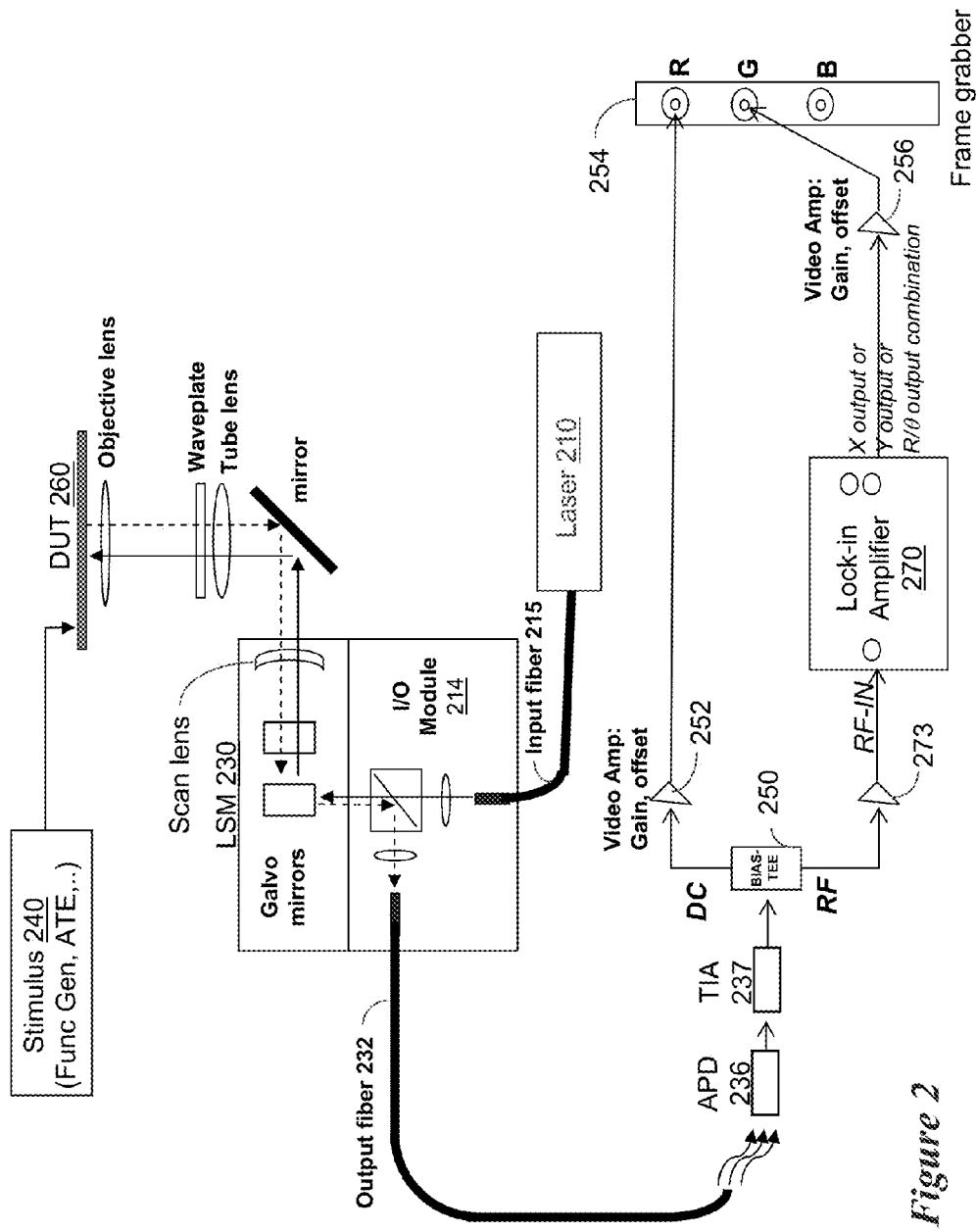
FIG. 2 is a diagram illustrating the main component of a system according to an embodiment of the invention.

FIG. 2 is a schematic of a system according to an embodiment of the invention for performing the phase detection and mapping. In FIG. 2, a lock-in amplifier is used in placed of the spectrum analyzer, which is used in the prior art known system. A laser source 210 provides a laser beam (shown as solid arrow) which is fed into the input fiber optics 215. An optical I/O module 214 shapes the beam and provide a conditioned beam to the LSM 230, which scans the conditioned beam onto a selected area of the DUT 260. In this particular example, the path form the LSM 230 to the DUT 260 includes a scanning lens, a reflecting mirror, a tube lens, a waveplate, and an objective lens. These elements are provided to properly scan the laser beam over the selected area of the DUT, but other elements can be used as needed for a particular design.

As the laser beam is scanned over the selected area of DUT 260, a stimulus signal 240 is applied to the DUT 260, such that active elements within the DUT 260 modulate, i.e., transistors within the DUT switch. The stimulus signal 240 can be generated by a function generator, an ATE, etc. As active devices switch, they change the absorption coefficient and the refractive index of the material making the device, e.g., silicon, such that the amplitude of the reflected laser beam (shown as broken arrow) is modulated correspondingly. The reflected beam is collected by the optical elements and directed onto the output fiber 232, which directs the beam onto a sensor. In this particular example an avalanche photodiode APD 236 is used, but other photosensors can be used, such as, e.g., PIN sensor. The output signal of the APD is input to trans-impedance amplifier 237 and the output of the TIA is input into a signal separator, such as a bias-tee (diplexer) 250, which outputs a DC component and an AC component. The DC component is amplified by the video amplifier 252 and is sent to the frame grabber 254 for generating an image of the scanned area of the DUT. The AC component (at RF frequency) is conditioned by RF amplifier 273 and is then sent to the lock-in amplifier 270. The output of the lock-in amplifier 270 is also amplified by a video amplifier 256 and is used to generate a phase image of the scanned area. As will be described more fully below, the X/Y or R/Θ output of the lock-in amplifier is converted into a gray scale image of the scanned area, wherein the values of the gray scale represent the phase of active devices in the scanned area of the DUT.

The operation of an embodiment of the invention that utilizes a lock-in amplifier will now be described. The X and Y values of the lock-in amplifier are proportional to the amplitude and relative phase of the signal, i.e., $$X \alpha V_{sig} \cos \Theta$$

$$Y \alpha V_{sig} \sin \Theta$$

Wherein $V_{sig}$ is the amplitude of the signal of interest (reflected laser beam), $\Theta$ is the phase difference between the signal of interest and a reference signal (e.g., a reference clock signal), i.e., $\Theta = \Theta_{sig} - \Theta_{ref}$. For a pair of transistors modulated at opposite states or polarity, the X or Y output values would be at opposite polarities, regardless of the phase of the input reference frequency. For example, if transistor A is modulating at $\Theta_1$, then transistor B is modulating at $\Theta_2 = \Theta_1 +/- 180°$ (out of phase). Therefore, the X value for transistor A is proportional to $\cos \Theta_1$, while the X value for transistor B is proportional to $\cos \Theta_1 +/- 180°$. That is:

$$X_A \alpha V_{sig} \cos \Theta_1$$

$$X_B \alpha V_{sig} \cos(\Theta_1 +/- 180°) = -V_{sig} \cos \Theta_1 = -X_A$$

Similarly, $$Y_A \alpha V_{sig} \sin \Theta_1$$

$$Y_B \alpha V_{sig} \sin(\Theta_1 +/- 180°) = -V_{sig} \sin \Theta_1 = -Y_A$$

Therefore, the relative logic states can be extracted from the lock-in amplifier's X or Y output. It should be noted, however, that this scheme is not limited to in phase and out of phase detection. Rather, so long as the phase difference between the two transistors is larger than ninety degrees, the X and Y values of these two transistors will be of opposite polarity, albeit at different absolute amplitude. The X or Y output of the lock-in amplifier may be converted to gray-scale image, wherein the values of each pixel corresponds to the phase at that spatial location.

According to another embodiment, a combination of the lock-in amplifier's R and Θ values are used. According to this embodiment:

$$R = V_{sig} = \sqrt{(X^2 + Y^2)}$$

$$\Theta = \tan^{-1}(Y/X)$$

Θ is the phase difference between the signal of interest and a reference signal. However, when the laser beam scans over an area of the IC where there are no transistors, there is no reflected RF electrical signal and the Θ value is random. Consequently, the Θ output voltage of the lock-in amplifier is random, which will be seen as noise. This can cause the Θ value coming from the transistors to be masked by the Θ "noise". Therefore, according to one embodiment the R output is monitored to determine whether the Θ output voltage value should be used or not, i.e., whether is Θ value is random or not. A reflected RF electrical signal will result in a non-zero value for R, which in turn allows the Θ value to be used for that particular pixel in the scanned area of the IC. On the other hand, a non-existing reflected RF electrical signal will give an almost zero value to R, which in turn disallows the use of the Θ value for that particular pixel. In one example, a threshold is set for the amplitude of R value which allows/disallows the use of the Θ value.

According to the above embodiment, for a pair of transistors modulating at opposing states, the difference in the Θ value would be a constant 180 degrees ($\Delta\Theta=\Theta_A-\Theta_B=180°$) regardless of the phase of the input reference frequency. A lock-in amplifier would typically output an analog voltage of +/−V to correspond to the measured phase difference of +/−180°. Since the phase difference is 180°, the analog voltage amplitude difference would be V ($\Delta V=V_A-V_B=V$). The relative polarity between the two transistors can be then extracted by setting a threshold value that is between $V_A$ and $V_B$ using various methods.

According to various other embodiments of the invention, the ability to observe relative logic states in the LVI is manifested by the introduction of 'RF interference' into the acquisition system, and supplying the resulting signal to a spectrum analyzer. The term acquisition system is meant to include any one or combination of the APD, the TIA, the Bias-Tee, the RF amplifier, and the spectrum analyzer, i.e., the 'RF interference' may be coupled into any of these or at any point in their connections. Herein, we refer to the frequency spectra of this 'RF interference' as 'interference' spectrum and it served a somewhat similar function to the reference signal in the embodiment of FIG. 2. In the following embodiments the use of a swept-tuned, superheterodyne spectrum analyzer is illustrated, but similar results can be achieved using other means, such as real-time spectrum analyzer (also called FFT spectrum analyzer), vector signal analyzer, etc.

For effective results, the 'RF interference' should be at the same frequency and be synchronous with the internal signals under analysis. If it meets these requirements, this 'RF interference' will interfere either constructively or destructively with the detected modulation (converted from optical to electrical by the acquisition system) of the transistors carrying the internal signals under analysis. If the destructive interference brings the amplitude of the electrical signal below the amplitude of the electrical signal of 'RF interference' alone, the resulting spectra would have less energy than the 'interference' spectra. Phase shifting of the 'RF interference' signal may be done to ensure that the 'RF interference' signal is in-phase and out-of-phase with the signals of interest for optimal/maximum constructive and destructive interference.

Figure 3:
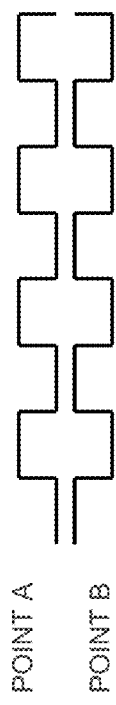
FIG. 3 is a diagram illustrating waveforms of signals at selected points A and B.

To illustrate, reference is now made to FIG. 3, showing waveforms of signals at selected points A and B. Assume for this example that point A and point B are the same instances of an inverter, connected in series. This means that the signals at point A and point B are out-of-phase or opposite logic states relative to each other. The modulation detected by the acquisition system is illustrated in FIG. 3, although in reality the signal level would be very low, between sub-microvolts to hundreds of microvolts, and requires averaging to achieve desired SNR. In this illustration, the term 'signal' refers to the electrical signal of the detected optical modulation. To a conventional spectrum analyzer, since both waveforms have the same amplitude, the power of the spectra at the frequency of interest is the same—there is no differentiation between points A and B.

Figure 4:
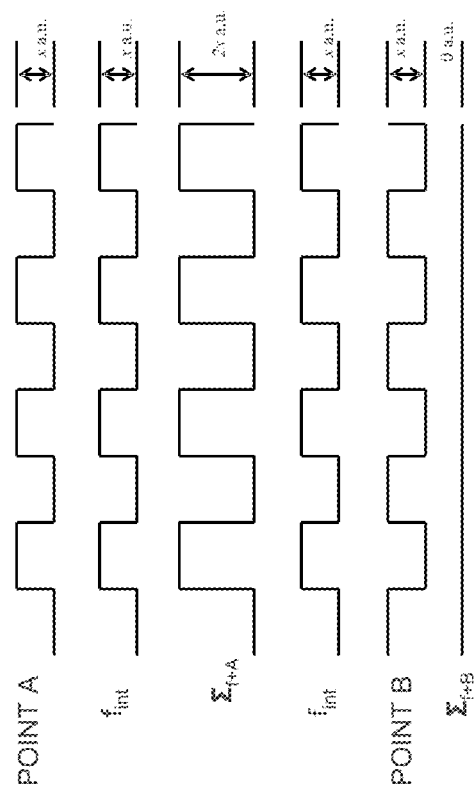
FIG. 4 is a diagram illustrating waveforms of signals at selected points A and B and their interference with an added interference signal.

Using embodiments of the invention, if 'RF interference' electrical signal, at the same frequency and also in synchronous with the above modulated signal, is introduced to the acquisition system, the electrical signals of the detected modulation at points A and B will interfere with this introduced signal. Such situations are illustrated in FIG. 4. If the 'RF interference' signal, shown as $f_{int}$ and having amplitude x a.u., interferes with the signal at point A (also having amplitude x a.u.), the resulting electrical signal would have added amplitude, i.e., 2 x a.u., as shown by waveform $\Sigma_{f+A}$. On the other hand, if the interference signal, $f_{int}$, interferes with the signal at point B, the resulting electrical signal would be a null, i.e., 0 a.u., as shown by waveform $\Sigma_{f+B}$. Therefore, there will be three different amplitudes at the spectrum of interest that the spectrum analyzer will measure.

2x a.u at point A x a.u. where there is no activity (only RF interference signal is measured)

0 a.u at point B

Normalizing this into a grayscale level, one would see white pixels at point A, gray pixels at points with no activity (background level), and black pixels at point B, hence providing a relative logic state mapping between point A and B.

As noted above, the introduction of an interference signal can be done at different points of the acquisition system. The 'RF interference' signal may be collected by a variety of ways, e.g., through an electrical connector or picked up by an antenna as there will be some amount of 'RF interference' electromagnetic waves emitted from the test cell (stimulus, DUT, etc). The 'RF interference' signal may then be coupled into the acquisition by a variety of ways, e.g., using a summing amplifier/voltage adder or through intentional transmission of 'RF interference' electromagnetic waves or through a simple electrical T-connection.

Regardless of the collection and coupling of the 'RF interference', the collected 'RF interference' signal needs to be gain conditioned (in simple terms based on the illustrations above). A programmable RF amplifier is required to either boost or attenuate the amplitude of the collected 'RF interference' signal, depending on how the signal was collected. The 'RF interference' signal may be also phase-conditioned to allow for maximum interference. One might require phase shifting the 'RF interference' signal if the gain-conditioning cannot achieve sufficient constructive or destructive interference due to the 'RF interference' signal having a slight phase-shift relative to a particular signal under analysis.

Figure 5:
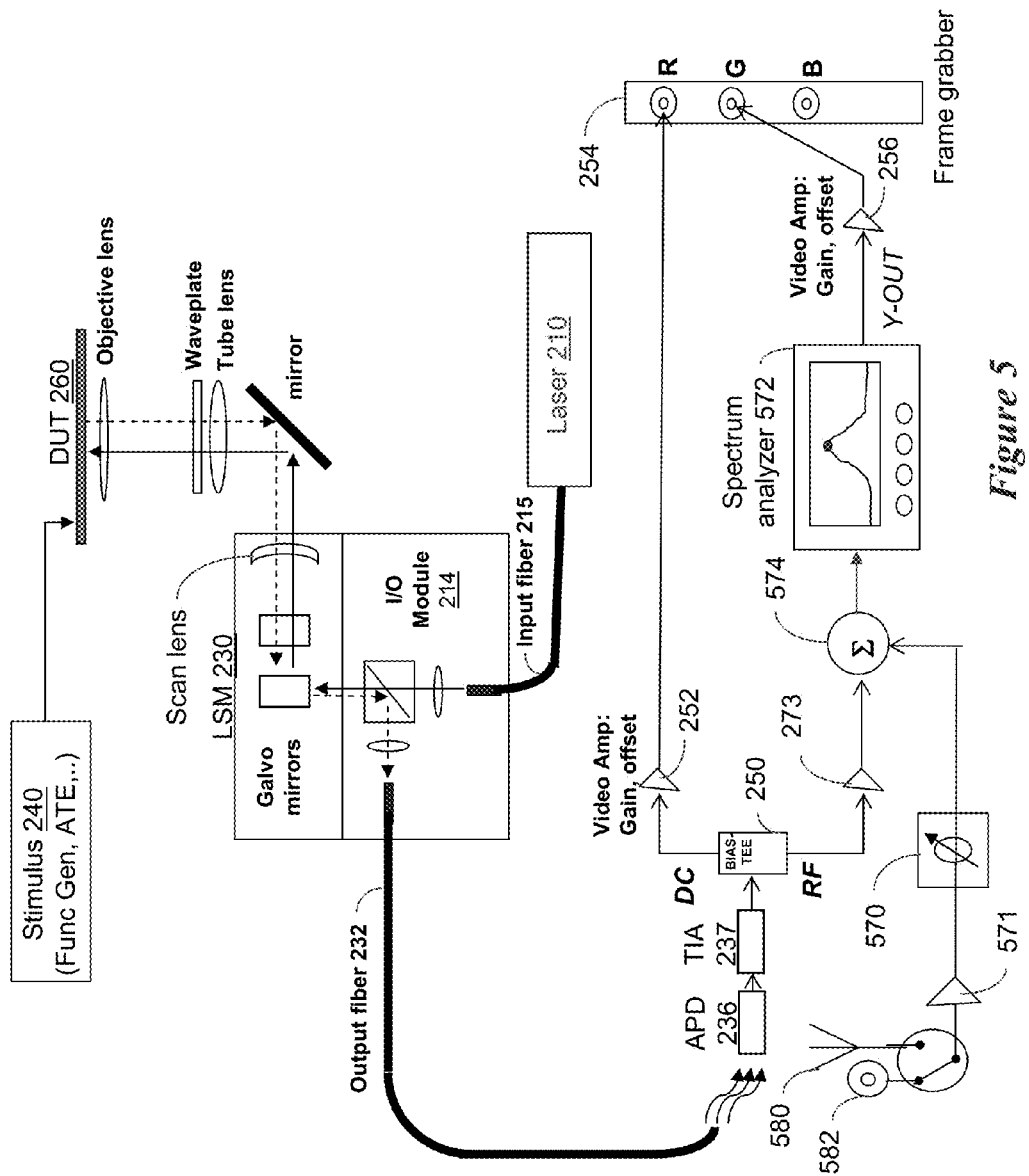
FIG. 5 is a diagram illustrating an embodiment of the invention wherein the 'RF interference' signal is added to the "conditioned" signal from the APD and is supplied to a spectrum analyzer. In this context, "conditioned" may mean amplified, shifted, converted from current to voltage and vice versa, etc.

FIG. 5 illustrates an embodiment of the invention wherein the 'RF interference' signal is collected through cables (electrical signal) or antenna (RF electromagnetic waves). The RF interference may be collected from the DUT, the tester (e.g. ATE), a tester board, a DUT board, or cables that interface these components. The 'RF interference' signal is conditioned (gain/attenuate and phase shift) before being added with a summing amplifier or voltage adder after the RF amplifier. The illumination and beam reflection collection parts of the embodiment of FIG. 5 are similar to that of FIG. 2 and would therefore, not be described here again. What follows is a description of the elements that are different from the embodiment of FIG. 2. Most notable, the lock-in amplifier of FIG. 2 if replaced by a spectrum analyzer 572 in FIG. 5. However, in order to enable the spectrum analyzer to detect and generate a signal indicative of phase, the following elements are added. Namely, an interference signal is collected from an antenna 580 or a cable 582 (note that while both antenna and cable are shown in this embodiment, this is for illustration only and one may include only one or the other or both). The interference signal is conditioned, i.e., amplified or attenuated, by the signal conditioner 571 and is then phase shifted by phase shifter 570. The conditioned interference signal is then input to a summing amplifier or voltage adder 574, to be added to the conditioned signal of the APD. The output is then provided to the spectrum analyzer 572. The output of the spectrum analyzer is provided to a video amplifier, which provides its signal to a data acquisition module. In this example, a frame grabber is used to generate a gray scale image mapping indicative of the phase of the active elements within the scanned area of the DUT. Of course, any other data acquisition card or module can be used.

Figure 6:
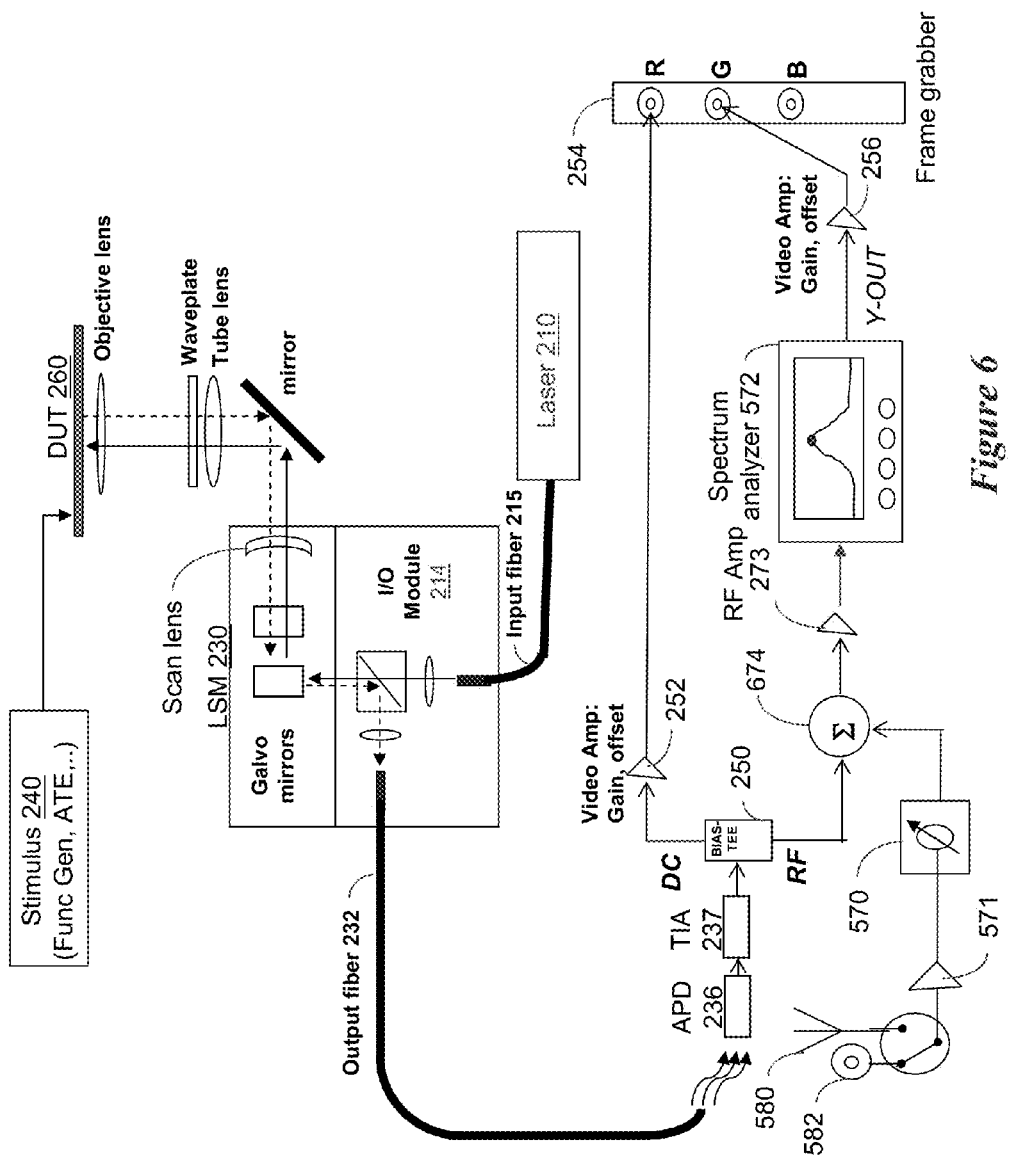
FIG. 6 depicts an embodiment of the present invention that is a variation of the embodiment of FIG. 5.

FIG. 6 depicts an embodiment of the present invention that is a variation of the embodiment of FIG. 5. Notably, in FIG. 6 the addition of the 'RF interference' signal is done before the RF amplifier 273. That is, the conditioned interference signal is added to the RF signal from the bias-tee 250 by the summing amplifier or voltage adder 674. The output of the adder 674 is then amplified by RF amplifier 273 and is then input to the spectrum analyzer.

Figure 7:
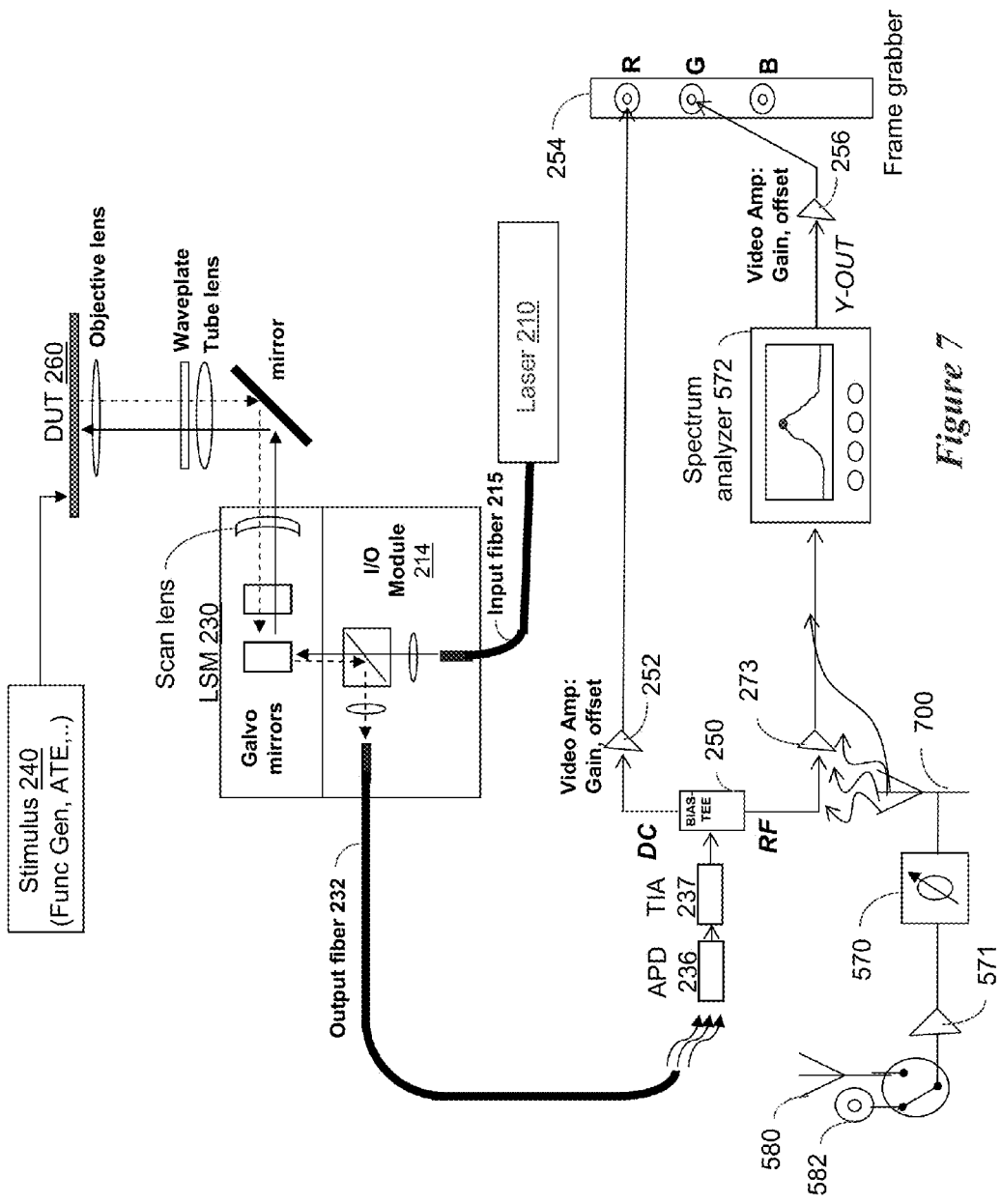
FIG. 7 depicts another embodiment of the present invention wherein the 'RF interference' signal is added to the "conditioned" signal from the APD and is supplied to a spectrum analyzer.

FIG. 7 depicts an embodiment of the present invention that is a variation of the embodiment of FIG. 5. Notably, in FIG. 7 the addition of the 'RF interference' signal is done by radiating the interference signal onto the electrical path of the APD signal. That is, the conditioned interference signal is applied by the RF gain/attenuator 570 and/or phase shifter 571 to an antenna 700. The antenna 700 is placed such that its radiation would be directed to the electrical path of the signal from the APD and be detected by and interfere with the signal of the TIA 237, Bias Tee 250 and/or amplifier 273. In this manner, the interference signal is added onto the signal that is input to the spectrum analyzer 572.

Figure 8:
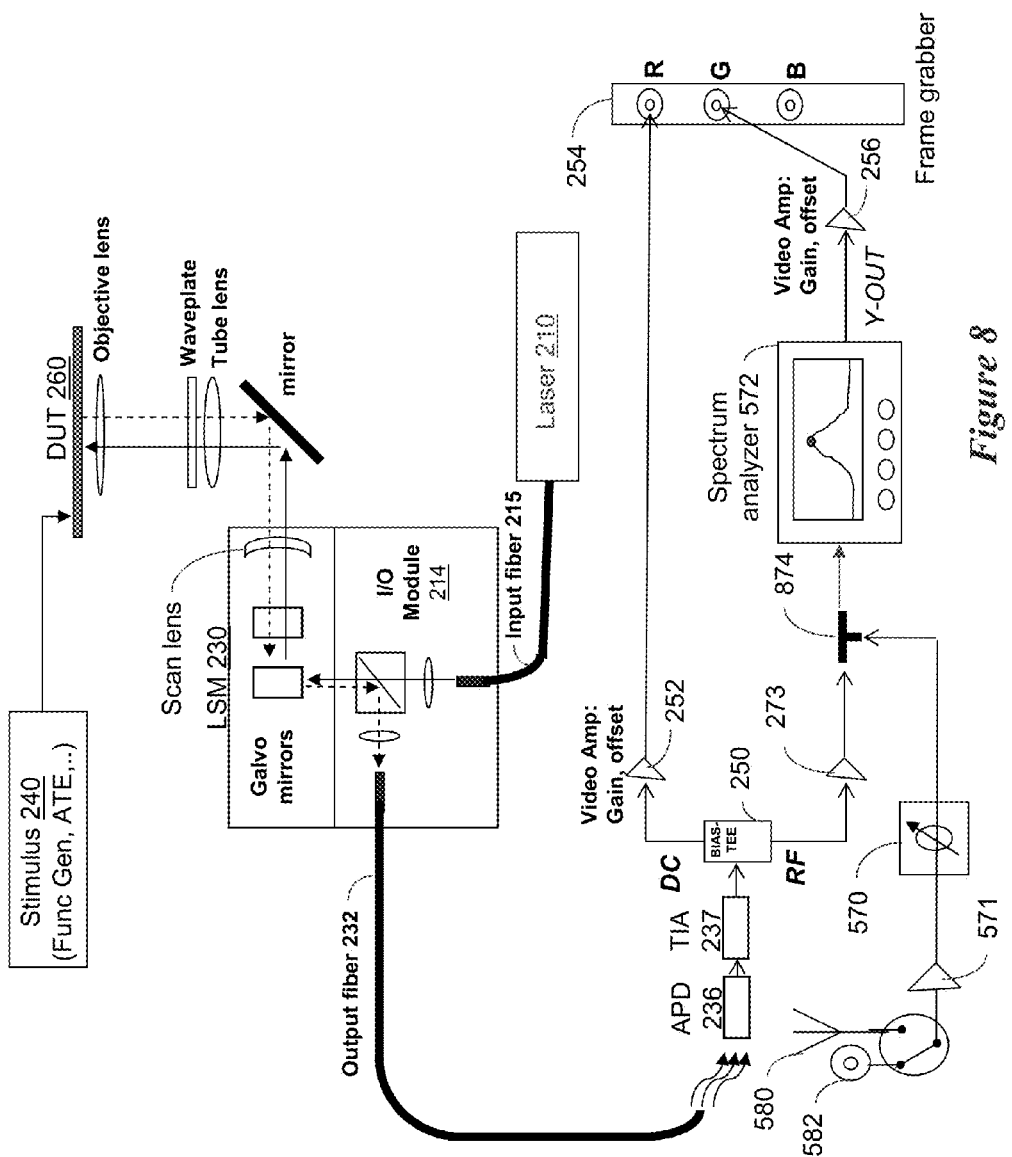
FIG. 8 depicts yet another embodiment of the present invention wherein the 'RF interference' signal is added to the "conditioned" signal from the APD and is supplied to a spectrum analyzer.

FIG. 8 depicts yet another embodiment of the present invention that is a variation of the embodiment of FIG. 5. Notably, in FIG. 8 the addition of the 'RF interference' signal is done by coupling the interference signal onto the conditioned APD signal using a T-connection coupler. That is, the conditioned interference signal is applied to T-connection 874 which also receives the conditioned signal from amplifier 273. In this manner, the interference signal is added onto the signal that is input to the spectrum analyzer 572.

While the invention has been described with reference to particular embodiments thereof, it is not limited to those embodiments. Specifically, various variations and modifications may be implemented by those of ordinary skill in the art without departing from the invention's spirit and scope, as defined by the appended claims. Additionally, all of the above-cited prior art references are incorporated herein by reference.

What is claimed is:

1. A method for state mapping of active devices within a device under test (DUT), comprising:
    illuminating a selected area of the DUT while the DUT is receiving test signals causing certain of the active devices to modulate, the selected area having at least two of the active devices situated therein and the two active devices modulating at opposing logic states;
    collecting reflected light from the selected area;
    converting the reflected light into an electrical signal;
    extracting relative phase information of the two active devices from the electrical signal to thereby extract the logic states of active devices within the DUT;
    generating a two-dimensional image from the phase information, wherein the two-dimensional image spatially correlates to the selected area.

2. The method of claim 1, wherein extracting phase information comprises mixing the electrical signal with an interference signal.

3. The method of claim 2, wherein mixing comprises applying the electrical signal and an interference signal to a spectrum analyzer.

4. The method of claim 3, further comprising collecting electromagnetic radiation emitted by at least one of the DUT, a tester, a test board, a DUT board, and cables to generate the interference signal.

5. The method of claim 4, further comprising conditioning the interference signal prior to the mixing.

6. The method of claim 5, wherein conditioning comprises at least one of: amplifying, attenuating, and phase shifting.

7. The method of claim 3, wherein mixing comprises combining the electrical signal and the interference signal in one of a summing amplifier and a voltage adder.

8. The method of claim 7, further comprising RF amplifying the electrical signal prior to combining.

9. The method of claim 3, wherein mixing comprises applying the electrical signal and the interference signal to a T-connector.

10. The method of claim 3, wherein generating a two-dimensional image comprises applying output of the spectrum analyzer to a data acquisition module.

11. The method of claim 2, wherein mixing the electrical signal with an interference signal comprises mixing the electrical signal with an RF interference signal.

* * * * *